(12) United States Patent
Anholt et al.

(10) Patent No.: US 8,954,831 B2
(45) Date of Patent: *Feb. 10, 2015

(54) ERROR CORRECTION CODES FOR INCREMENTAL REDUNDANCY

(71) Applicant: Apple Inc., Cupertino, CA (US)

(72) Inventors: Micha Anholt, Tel-Aviv (IL); Naftali Sommer, Rishon le-Zion (IL)

(73) Assignee: Apple Inc., Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/336,066

(22) Filed: Jul. 21, 2014

(65) Prior Publication Data

US 2014/0351669 A1    Nov. 27, 2014

Related U.S. Application Data

(63) Continuation of application No. 13/405,308, filed on Feb. 26, 2012, now Pat. No. 8,788,922.

(60) Provisional application No. 61/447,111, filed on Feb. 28, 2011.

(51) Int. Cl.
*G06F 11/00* (2006.01)
*H03M 13/00* (2006.01)
*G06F 11/10* (2006.01)

(52) U.S. Cl.
CPC ................................... *G06F 11/10* (2013.01)

USPC ............ 714/801; 714/752; 714/755; 714/758

(58) Field of Classification Search
USPC .................................. 714/752, 755, 758, 801
See application file for complete search history.

(56) References Cited

U.S. PATENT DOCUMENTS

| 2005/0193312 A1* | 9/2005 | Smith et al. ................... 714/755 |
| 2008/0140686 A1* | 6/2008 | Hong et al. .................... 707/100 |
| 2010/0169734 A1* | 7/2010 | Gamage et al. ............... 714/752 |
| 2011/0154151 A1* | 6/2011 | Matsumoto et al. .......... 714/752 |

* cited by examiner

*Primary Examiner* — Sam Rizk
(74) *Attorney, Agent, or Firm* — Meyertons, Hood, Kivlin, Kowert & Goetzel, P.C.

(57) ABSTRACT

A method includes accepting input including at least part of a codeword that has been encoded by an ECC defined by a set of parity check equations. The codeword includes data bits and parity bits. A decoding process is applied to the codeword using the data bits and only a first partial subset of parity bits in the input, and using only a second partial subset of equations. Upon a failure to decode the codeword using the partial subsets, the codeword is re-decoded using the data bits and all parity bits in the input, and using all equations. The set of parity check equations is defined such that any parity bit in the codeword appears in multiple equations, and any parity bit in the first partial subset of the parity bits appears in a plurality of equations in the second partial subset of the equations.

17 Claims, 3 Drawing Sheets

ERROR CORRECTION CODES FOR INCREMENTAL REDUNDANCY

CROSS-REFERENCE TO RELATED APPLICATIONS

This application is a continuation of U.S. patent application Ser. No. 13/405,308, filed Feb. 26, 2012, which claims the benefit of U.S. Provisional Patent Application 61/447,111, filed Feb. 28, 2011, whose disclosure is incorporated herein by reference.

FIELD OF THE INVENTION

The present invention relates generally to Error Correction Coding (ECC), and particularly to methods and systems for incremental redundancy schemes.

BACKGROUND OF THE INVENTION

Incremental redundancy schemes are error correction schemes in which the amount of redundancy used in the decoding process is increased incrementally, for example depending on decoding performance Incremental redundancy schemes are described, for example, by Shiozaki in "Adaptive Type-II Hybrid Broadcast ARQ System," IEEE Transactions on Communications, volume 44, issue 4, April, 1996, pages 420-422, which is incorporated herein by reference. The paper describes a type-II hybrid broadcast Automatic-Repeat-reQuest (ARQ) scheme with Adaptive Forward Error Correction (AFEC) using Bose-Chaudhuri-Hocquenghem (BCH) codes. The proposed scheme increases the error correcting capability of BCH codes according to each channel state using incremental redundancy.

As another example, U.S. Patent Application Publication 2008/0282106, whose disclosure is incorporated herein by reference, describes a method for operating a memory. The method includes encoding input data with an Error Correction Code (ECC) to produce input encoded data including first and second sections, such that the ECC is decodable based on the first section at a first redundancy, and based on both the first and the second sections at a second redundancy that is higher than the first redundancy. Output encoded data is read and a condition is evaluated. The input data is reconstructed using a decoding level selected, responsively to the condition, from a first level, at which a first part of the output encoded data corresponding to the first section is processed to decode the ECC at the first redundancy, and a second level, at which the first part and a second part of the output encoded data corresponding to the second section are processed jointly to decode the ECC at the second redundancy.

SUMMARY OF THE INVENTION

An embodiment that is described herein provides a method for error correction. The method includes accepting input including at least part of a code word that has been encoded by an Error Correction Code (ECC) defined by a set of parity check equations. The code word includes data bits and parity bits. A decoding process is applied to the code word using the data bits and only a first partial subset of the parity bits that were included in the input, and using only a second partial subset of the parity check equations. Upon a failure to decode the code word using the first and second partial subsets, the code word is re-decoded using the data bits and all the parity bits that were included in the input, and using all the parity check equations in the set. The set of the parity check equations is defined such that any parity bit in the code word appears in multiple parity check equations in the set, and any parity bit in the first partial subset of the parity bits appears in a plurality of parity check equations in the second partial subset of the parity check equations.

In some embodiments, the ECC includes a systematic ECC that is representable by a parity check matrix having a data sub-matrix and a parity sub-matrix. In an embodiment, a first sub-matrix of the parity sub-matrix corresponding to the first partial subset of the parity bits and to the second partial subset of the parity check equations is lower triangular, except for a group of last columns of the first sub-matrix. In another embodiment, a first sub-matrix of the parity sub-matrix corresponding to the parity bits other than the first partial subset and to the parity check equations other than the second partial subset is lower triangular, except for a group of last columns of the first sub-matrix.

In yet another embodiment, the parity sub-matrix includes a rectangular block of elements that are equal to zero below a main diagonal of the parity sub-matrix. In still another embodiment, a first sub-matrix of the parity sub-matrix corresponding to the first partial subset of the parity bits and to the parity check equations other than the second partial subset includes elements that are equal to zero, except for one or more last columns of one or more first rows of the first sub-matrix.

In a disclosed embodiment, the second partial subset of the parity check equations is equal in size to the first partial subset of the parity bits. In an alternative embodiment, the second partial subset of the parity check equations is smaller in size than the first partial subset of the parity bits.

In some embodiments, accepting the input includes reading the data bits and the first partial subset of the parity bits from a memory device in order to apply the decoding process, and, upon the failure, reading the parity bits other than the first partial subset from the memory device in order to re-decode the code word. In alternative embodiments, accepting the input includes receiving the data bits and the first partial subset of the parity bits from a communication receiver in order to apply the decoding process, and, upon the failure, receiving the parity bits other than the first partial subset from the communication receiver in order to re-decode the code word.

There is additionally provided, in accordance with an embodiment of the present invention, apparatus for error correction including an interface and decoding circuitry. The decoding circuitry is configured to accept via the interface input including at least part of a code word that has been encoded by an Error Correction Code (ECC) defined by a set of parity check equations, the code word including data bits and parity bits. The decoding circuitry is configured to apply a decoding process to the code word using the data bits and only a first partial subset of the parity bits that were included in the input and using only a second partial subset of the parity check equations, and, upon a failure to decode the code word using the first and second partial subsets, to re-decode the code word using the data bits and all the parity bits that were included in the input and using all the parity check equations in the set. The set of the parity check equations is defined such that any parity bit in the code word appears in multiple parity check equations in the set, and any parity bit in the first partial subset of the parity bits appears in a plurality of parity check equations in the second partial subset of the parity check equations.

The present invention will be more fully understood from the following detailed description of the embodiments thereof, taken together with the drawings in which:

DETAILED DESCRIPTION OF EMBODIMENTS

Overview

Figure 1:
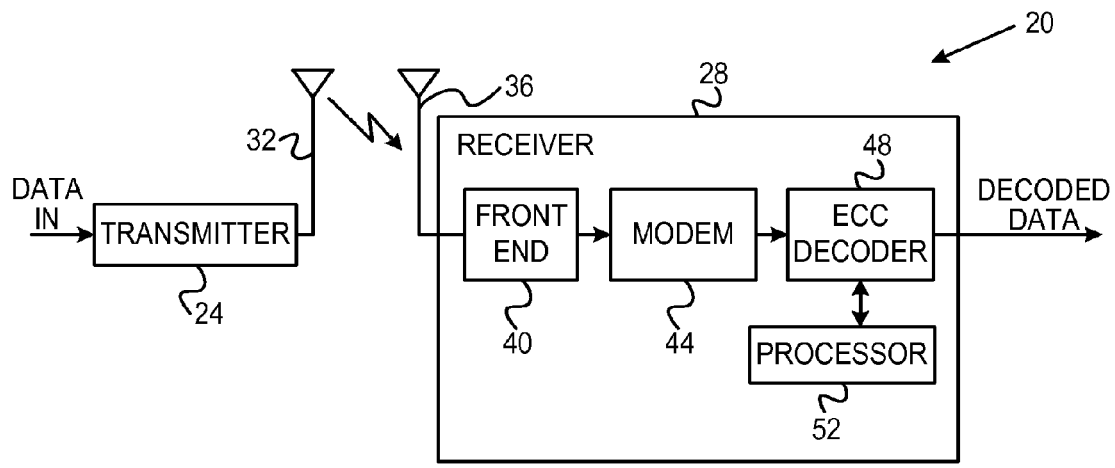
FIG. 1 is a block diagram that schematically illustrates a communication system that employs incremental redundancy, in accordance with an embodiment of the present invention.

Embodiments of the present invention that are described hereinbelow provide improved Error Correction Codes (ECCs) for use in incremental redundancy schemes, and methods and systems for decoding such codes. In the disclosed embodiments, an ECC is defined by a set of parity check equations, or equivalently by a parity check matrix. Each code word of the ECC comprises data bits and parity bits. An ECC decoder makes an initial attempt to decode a code word using the data bits and only a partial subset of the parity bits and a partial subset of the parity check equations. If the initial decoding attempt fails, the ECC decoder re-decodes the code word using the data bits, all the parity bits of the code word, and all the parity check equations. Schemes of this sort match the error correction capability of the ECC to the actual number of errors in the code word, and incur no more than the minimum necessary complexity, latency and power consumption.

The ECCs described herein are designed to provide high performance when used in an incremental redundancy scheme, both in the initial decoding attempt and in the subsequent re-decoding operation. For example, in some embodiments the parity check equations (or, equivalently, the parity check matrix) are designed such that any parity bit in the code word appears in multiple parity check equations in the set, and such that any parity bit in the partial subset of parity bits (used in the initial decoding attempt) appears in multiple parity check equations in the partial subset of the equations used in that attempt. This sort of ECC avoids scenarios in which a certain parity bit appears in only a small number of parity check equations. Such a scenario may cause the ECC decoder to converge to a wrong code word.

As another example, in some embodiments the parity check matrix is divided into a data sub-matrix (corresponding to the data bits) and a parity sub-matrix (corresponding to the parity bits). The parity sub-matrix is set to be lower-triangular except for the last column or several columns. In some embodiments, the portion of the parity sub-matrix that is used in the initial decoding attempt is also designed in this manner. This kind of nearly-lower-triangular parity check matrix simplifies the decoding process, since it enables the decoder to use back-substitution rather than matrix inversion. At the same time, this design ensures that each parity bit appears in multiple parity check equations, in accordance with the condition explained above.

As yet another example, in some embodiments the parity sub-matrix of the parity check matrix contains an all-zero rectangular (typically square) block below the main diagonal. This feature ensures that some parity bits do not appear in a group of parity check equations, and therefore these equations can be used even if the parity bits are not available.

Examples of parity check matrices that meet the above conditions are described herein. The resulting ECCs are optimized for use in incremental redundancy schemes, since their design considers both the initial decoding attempt and the subsequent re-decoding operation. The disclosed techniques can be used in a wide variety of systems and applications in which incremental redundancy is deployed, such as in various communication and data storage systems.

System Description

FIG. 1 is a block diagram that schematically illustrates a wireless communication system 20 that employs incremental redundancy, in accordance with an embodiment of the present invention. System 20 comprises a transmitter 24, which transmits data to a receiver 28. The transmitter accepts input data, encodes the data with an ECC, modulates the encoded data in accordance with a certain modulation scheme, converts the modulated digital signal to an analog signal, up-converts the analog signal to a suitable Radio frequency (RF), and transmits the RF signal toward the receiver using a transmit antenna 32.

In receiver 28, a receive antenna 36 receives the RF signal and provides it to a RF front end 40. The front end down-converts the RF signal to baseband or to a suitable Intermediate Frequency (IF), and digitizes the signal with a suitable Analog to Digital Converter (ADC—not shown in the figure). The digitized signal carrying the ECC-encoded data is demodulated by a modem 44, and the ECC is decoded by an ECC decoder 48. ECC decoder 48 carries out an incremental redundancy ECC scheme that is described herein. By decoding the ECC, decoder 48 reconstructs the data that was input to transmitter 24. The reconstructed data is provided as the receiver output. A processor 52 manages the operation of receiver 28.

System 20 may comprise, for example, a cellular system, a satellite system, a point-to-point communication link, or any other suitable communication system that employs ECC. Although the example of FIG. 1 refers to a wireless communication system, the techniques described herein can be used with wire-line communication systems, such as cable communication systems, as well.

Figure 2:
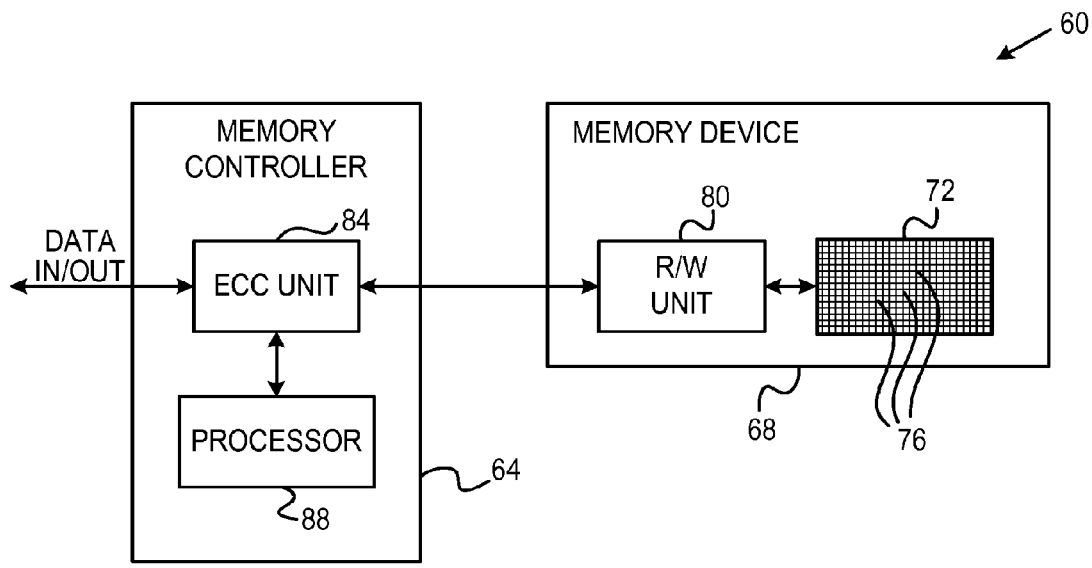
FIG. 2 is a block diagram that schematically illustrates a data storage system that employs incremental redundancy, in accordance with an embodiment of the present invention.

FIG. 2 is a block diagram that schematically illustrates a data storage system 60 that employs incremental redundancy, in accordance with an alternative embodiment of the present invention. System 60 comprises a memory controller 64, which stores data in a memory device 68. The memory device comprises an array 72 comprising multiple memory cells 76. Array 72 may comprise any suitable type of volatile or non-volatile memory, such as, for example, Random Access Memory (RAM) or Flash memory. Alternatively, device 68 may comprise a magnetic storage device such as a Hard Disk Drive (HDD), or any other suitable storage medium. System 60 can be used in various host systems and devices, such as in computing devices, cellular phones or other communication terminals, removable memory modules ("Flash drive" devices), Solid State Disks (SSD), digital cameras, music and other media players and/or any other system or device in which data is stored and retrieved.

Memory device 68 comprises a Read/Write (R/W) unit 80, which writes data values into memory cells 76 and reads data values from the memory cells. Memory controller 64 comprises an ECC unit 84, which encodes the data for storage with a certain ECC, and decodes the ECC of data that is retrieved from the memory cells. ECC unit 84 carries out an incremental redundancy ECC scheme that is described herein. A processor 88 manages the operation of memory controller 64.

ECC decoder 48 and ECC unit 84 can be implemented in software, in hardware or using a combination of hardware and software elements. In some embodiments, ECC decoder 48 and ECC unit 84 may be implemented using general-purpose processors, which are programmed in software to carry out the functions described herein. The software may be downloaded to the processors in electronic form, over a network, for example, or it may, alternatively or additionally, be provided and/or stored on tangible media, such as magnetic, optical, or electronic memory.

The incremental redundancy schemes described herein can be used in communication systems such as system 20, as well as in data storage systems such as system 60. The description that follows applies to both communication applications and to storage applications, and refers generally to an ECC decoder. Any reference to the ECC decoder applies to decoder 48 of system 20, as well as to the decoder functionality of unit 84 in system 60. Alternatively, the methods described herein can be carried out by any suitable element in any suitable system that involves ECC decoding using incremental redundancy.

Figure 3:
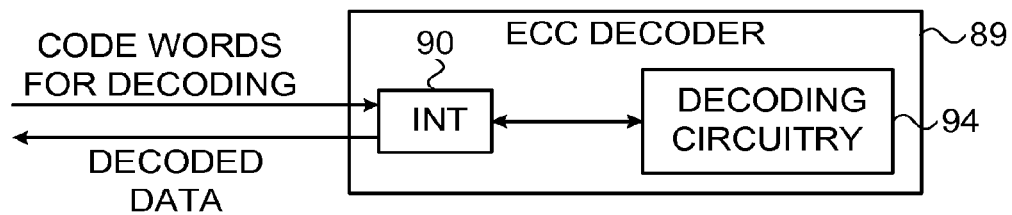
FIG. 3 is a block diagram that schematically illustrates an ECC decoder, in accordance with an embodiment of the present invention.

FIG. 3 is a block diagram that schematically illustrates an ECC decoder 89, in accordance with an embodiment of the present invention. ECC decoder 89 can be used, for example, to implement ECC decoder 48 of FIG. 1 or ECC unit 84 of FIG. 2. ECC decoder 89 comprises an interface 90 for receiving code words for decoding and for outputting decoded data extracted from decoded code words. Decoding circuitry 94 decodes code words that are provided to decoder 89 and outputs the decoded data. Typically, circuitry 94 holds a definition of an ECC and corresponding incremental redundancy scheme, as will be explained in detail below. Circuitry 94 carries out incremental redundancy decoding in accordance with this definition.

Incremental Redundancy Schemes

In an incremental redundancy scheme, the parity bits of a given code word are divided into two or more parts. The embodiments described herein refer to two parts (referred to herein as first parity bits and second parity bits), but the disclosed techniques can be used to implement incremental redundancy schemes that divide the parity bits into any desired number of parts. In a typical decoding process, ECC decoder 89 first attempts to decode an input code word using only the data bits and the first parity bits. If decoding fails, decoder 89 re-decodes the code word using the data bits, the first parity bits and the second parity bits.

In a typical communication application (e.g., in system 20 of FIG. 1), receiver 28 initially receives a part of the code word comprising the data bits and only the first parity bits, and ECC decoder 48 attempts to decode the code word based on this information. If decoding fails, the receiver requests and receives the second parity bits, and the ECC decoder re-decodes the code word using the second data bits as well.

In a typical storage application (e.g., in system 60 of FIG. 2), memory controller 64 stores the data bits and first parity bits of a given code word in one storage location in memory device 68 (e.g., in one memory page), and the second parity bits in another storage location (e.g., in another memory page). The memory controller initially reads the data bits and the first parity bits, often in a single read operation, and ECC unit 84 attempts to decode the code word using this information. If decoding fails, the memory controller reads the second parity bits, and ECC unit 84 re-decodes the code word using the data bits, the first parity bits and the second parity bits.

Parity Check Matrices Optimized for Incremental Redundancy

Embodiments of the present invention that are described herein provide improved error correction codes (ECCs), which are designed for providing high performance in incremental redundancy schemes. Each disclosed ECC is defined by a set of parity check equations, i.e., equations defined over the code word bits and evaluate to zero for valid code words. Equivalently, the ECC can be represented by a parity check matrix. In alternative embodiments, however, the disclosed ECCs can be defined in other suitable ways. The embodiments described herein refer mainly to Low Density Parity Check (LDPC) codes, but the disclosed techniques can be used to design other suitable types of ECC.

A parity check matrix H of a given ECC defines the valid code words y of the ECC as a null space, i.e., the vectors y for which $H \cdot y = 0$. The embodiments described herein focus on systematic ECCs. In a systematic ECC, each code word that encodes a group of data bits comprises the original data bits followed by parity bits. Each column of the parity check matrix corresponds to (and multiplies) a respective bit position in the code word, and each row of the parity check matrix corresponds to a respective parity check equation.

For a systematic ECC, the parity check matrix can be written as $H=[H_x \ H_p]$ wherein $H_x$ comprises the columns of H that correspond to (multiply) the data bits, and $H_p$ comprises the columns of H that correspond to the parity bits. Matrix $H_x$ is referred to herein as the data part or data sub-matrix of matrix H. Matrix $H_p$ is referred to herein as the parity part or parity sub-matrix of matrix H. A code word can be written as a vector of the form $$\begin{pmatrix} x \\ p \end{pmatrix},$$

wherein x denotes the data bits and p denotes the parity bits. Decoding circuitry 94 may decode the code word by solving $p = H_p^{-1}(H_x x)$.

In some embodiments, ECC decoder 89 applies an incremental redundancy scheme using the above-described ECC. In such a scheme, decoding circuitry 94 initially attempts to decode an input code word using the data part $H_x$ and only a subset of the columns of the parity part $H_p$. If decoding fails, circuitry 94 re-decodes the code word using the entire matrix H, i.e., using the data part $H_x$ and all the columns of the parity part $H_p$.

In some embodiments, parity part $H_p$ is designed while considering several design trade-offs:

If the elements of the parity part $H_p$ are zero above the main diagonal in most columns, decoding circuitry 94 may use back-substitution when calculating most of the redundancy bits. As a result, decoding is simplified.

When the elements of $H_p$ are non-zero above the main diagonal, decoding circuitry 94 may need to revert to more complex methods, such as matrix inversions.

When using only some of the columns of parity part $H_p$, some of the parity check equations cannot be solved and become unusable because they contain unknown bits. It is desirable to retain as many usable parity check equations as possible when the unknown bits are removed. One solution that achieves this goal is to set large blocks in the parity part $H_p$ to be all-zero.

When using only some of the columns of parity part $H_p$, it is desirable that any bit will participate in multiple parity check equations. If a certain bit appears in only few parity check equations (in the extreme case in a single equation), this bit is less protected and decoding may converge to a wrong code word.

Figure 4:
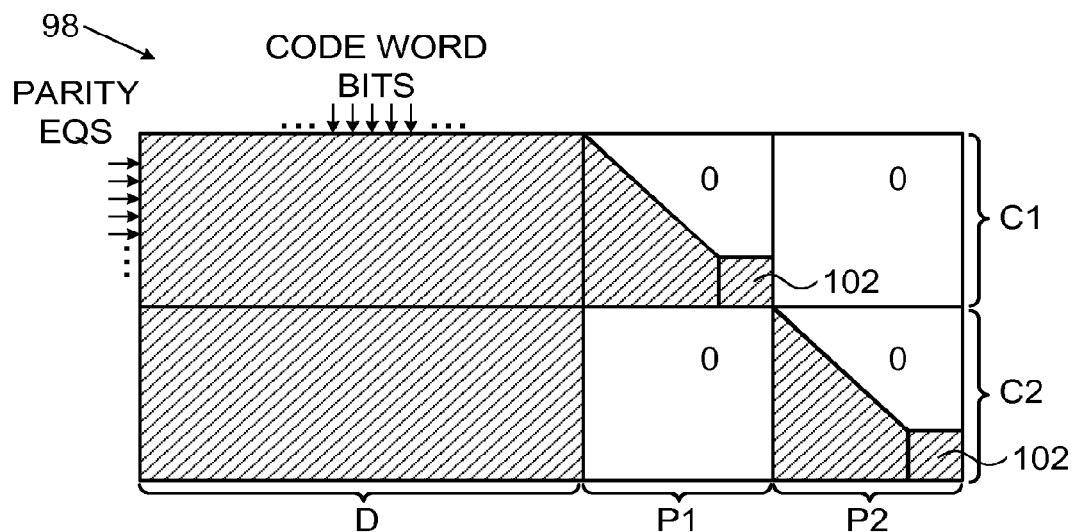
FIGS. 4 and 5 are diagrams showing parity check matrices of Low-Density Parity Check (LDPC) codes used in incremental redundancy schemes, in accordance with embodiments of the present invention.

FIG. 4 is a diagram showing a parity check matrix 98 of an LDPC code used in an incremental redundancy scheme, in accordance with an embodiment of the present invention. Areas of matrix 98 that are marked with a shaded pattern contain elements that are not constrained to zero, although some elements may be zero. Areas of the matrix that are not shaded contain all-zero elements.

The data part of matrix 98, on the left-hand-side of the matrix, is denoted D. The parity part of matrix 98, on the right-hand-side of the matrix, is divided into two matrices denoted P1 and P2, each comprising a subset of the columns of the parity part. The rows of matrix 98 (and thus the parity check equations) are divided into two subsets denoted C1 and C2.

In the incremental redundancy scheme, decoding circuitry 94 initially attempts to decode an input code word using only D and P1 (and using only the data bits and the parity bits of the code word that correspond to P1), and using only parity check equations C1. C1 in this example has the same magnitude as P1 (i.e., the number of parity check equations is equal to the number of parity bits). If the initial decoding attempt fails, decoding circuitry 94 re-decodes the code word using D, P1 and P2 (and using the data bits and all parity bits of the code word), and using the complete set of parity check equations C1 and C2. C2 in this example has the same magnitude as P2.

As can be seen in FIG. 4, the parity part of matrix 98 is designed in accordance with the above-described trade-offs: The parity part is nearly lower-triangular, except for two k-by-k areas 102. In other words, other than the k columns of each area 102, the elements of the parity part are zero above the main diagonal. Therefore, decoding circuitry 94 may use back substitution when calculating most of the parity bits, thereby simplifying the decoding process. (Generally, areas 102 need not necessarily have the same size.)

Areas 102 cause the parity part to deviate from a pure lower-triangular form. If the parity part were purely lower-triangular, the code word bits corresponding to the lower-right corner would appear in a small number of parity check equations, and the code would be severely weakened. The extreme case would be the bit corresponding to the last column, which would appear in only a single equation. This potential weakness applies both to the initial decoding attempt (i.e., to the intersection of P1 and C1) and to the re-decoding operation (i.e., to the entire parity part). Areas 102 ensure that each code word bit appears in multiple parity check equations, both in the initial decoding attempt and in the re-decoding operation. The minimal number of equations in which each bit appears is k.

Moreover, the rectangular block at the intersection of P1 and C2 contains only elements equal to zero. This feature ensures that some parity bits (the parity corresponding to P1) do not appear in a group of parity check equations (the equations corresponding to C2), and therefore these equations can be used even if the parity bits are not available.

Figure 5:
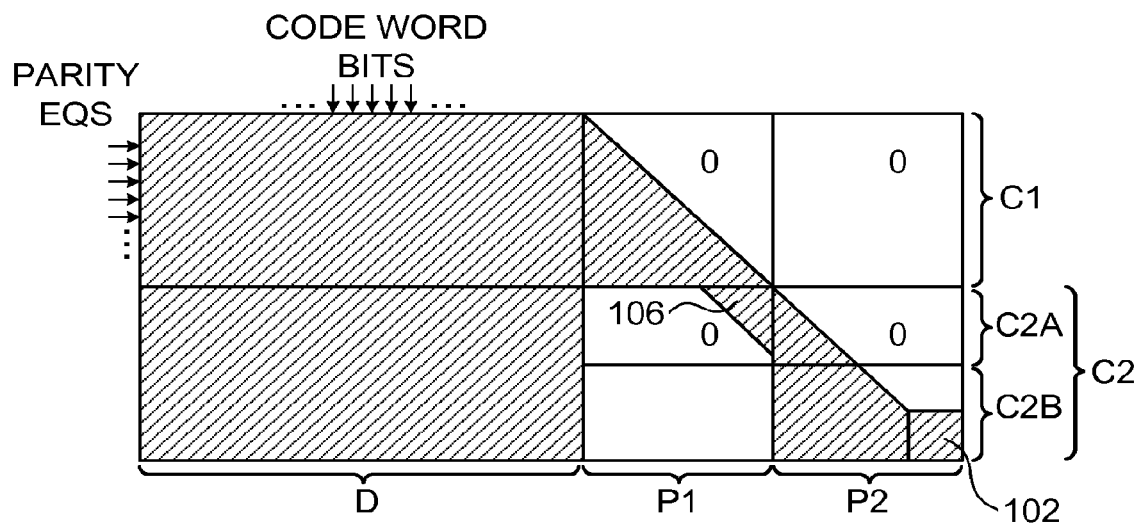

FIG. 5 is a diagram showing a parity check matrix of an LDPC code used in an incremental redundancy scheme, in accordance with another embodiment of the present invention. The matrix areas that are constrained to be zero in this example are different from those in FIG. 4 above. In the present example, the second subset of rows (and thus parity check equations) C2 is sub-divided into subsets C2A and C2B. In the initial decoding attempt, decoding circuitry 94 attempts to decode an input code word using D and P2 (and using the data bits and only the parity bits of the code word that correspond to P2), and using only the parity check equations C2B. C2B in this case has a smaller magnitude than P2.

If decoding fails, circuitry 94 re-decodes the code word using D, P1 and P2 (and using the data bits and all the parity bits of the code word), and using parity check equations C1, C2A and C2B. Unlike the initial decoding attempt, in the re-decoding operation the number of parity check equations is equal to the number of parity bits.

In the example of FIG. 5, an area 102 is defined similarly to the matrix of FIG. 4 above. Unlike the matrix of FIG. 4, however, an area 106 is defined at the top-right of the intersection of P1 and C2. The matrix elements in area 106 are not constrained to zero. In other words, the matrix elements in the block at the intersection of P1 and C2 are constrained to zero, except for the one or more last elements of the one or more first rows of the block. This feature ensures that each parity bit appears in multiple parity check equations. Since area 106 is below the main diagonal of the parity part (unlike area 102), this feature does not prevent the use of back substitution by the ECC decoder.

The above-described ECCs and corresponding incremental redundancy schemes provide a certain initial error correction capability, which is achieved with relatively small complexity, latency and power consumption. In cases where the initial error correction capability is insufficient, additional error correction capability is provided at the expense of additional complexity, latency and power consumption.

In the scheme of FIG. 4, in the initial decoding attempt the number of parity check equations is already equal to the number of parity bits. This performance advantage, however, typically comes at the expense of more complex encoding. The scheme of FIG. 5, on the other hand, has simpler decoding, but offers lower error correction capability in the initial decoding attempt. Moreover, the scheme of FIG. 5 typically involves rearrangement of the data so that the P2 parity bits are stored (or transmitted) with the data bits and the P1 parity bits are stored elsewhere (or transmitted later).

The ECCs and incremental redundancy schemes of FIGS. 4 and 5 are chosen purely by way of example. In alternative embodiments, any other suitable ECCs and incremental redundancy schemes that are designed per the above-described considerations can be used. Typically, decoding circuitry 94 in ECC decoder 89 holds a definition of the ECC, including the partitioning of the parity part into subsets, and the subsets of parity check equations that are to be used in each stage of the incremental decoding process. Circuitry 94 carries out the incremental redundancy scheme in accordance with the definition.

Figure 6:
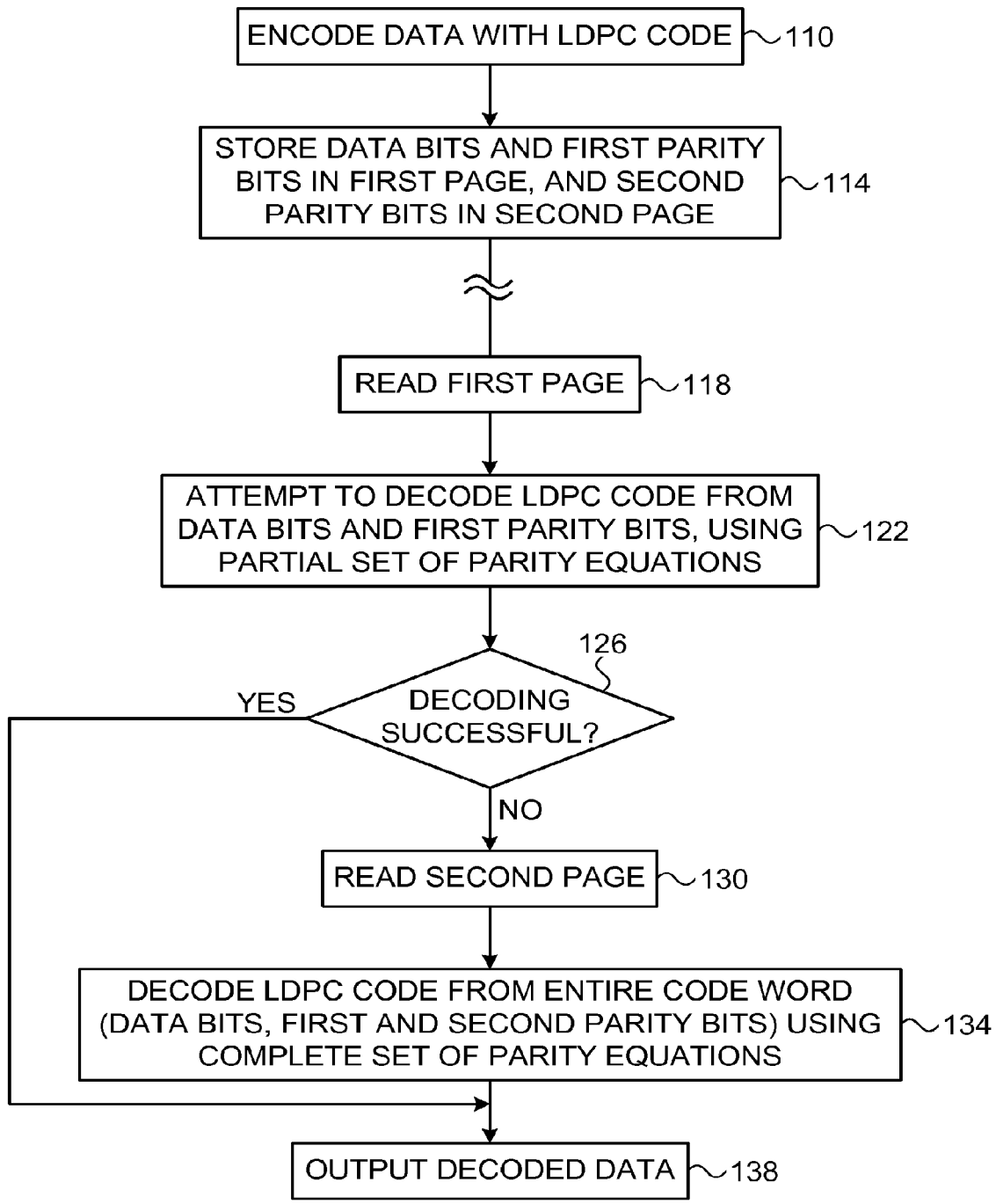
FIG. 6 is a flow chart that schematically illustrates a method for data storage using incremental redundancy, in accordance with an embodiment of the present invention.

FIG. 6 is a flow chart that schematically illustrates a method for data storage using incremental redundancy, in accordance with an embodiment of the present invention. The method is described in the context of data storage system 60 of FIG. 2, for the sake of clarity. The method can be used in a similar manner in a communication system such as system 20 of FIG. 1.

The method begins with ECC unit 84 decoding data for storage with an LDPC code, at an encoding step 110, to produce a code word. Memory controller 64 stores the code word in memory device 68, at a storage step 114. The memory controller divides the parity bits of the code word into first parity bits and second parity bits, stores the data bits and the first parity bits in a first memory page, and stores the second parity bits in a second memory page.

At a later point in time, memory controller 64 prepares to retrieve the data, e.g., in response to a request from a host. Memory controller 64 reads the first memory page from memory device 68, at a first readout step 118. The first memory page comprises the data bits and the first parity bits of the code word, but not the second parity bits. ECC unit 84 attempts to decode the code word using the data bits and the first parity bits, at an initial decoding step 122. The initial decoding attempt of step 122 is performed using a partial subset of the parity check equations.

The memory controller checks whether the initial decoding attempt was successful, at a checking step 126. If successful, the memory controller outputs the decoded data, at an output step 138, and the method terminates.

Otherwise, the memory controller reads the second memory page (comprising the second parity bits) from memory device 68, at a second readout step 130. ECC unit 84 then re-decodes the code word using the data bits, the first parity bits and the second parity bits, at a re-decoding step 134. The re-decoding of step 134 is performed using the complete set of parity check equations. The memory controller outputs the decoded data at output step 138.

It will be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. An apparatus, comprising:
a front-end unit configured to:
receive a radio frequency (RF) signal, wherein the RF signal includes data encoded with an error correction code (ECC), wherein the ECC is defined by a plurality of parity check equations, and wherein a parity check matrix representing the ECC includes a data sub-matrix and a parity sub-matrix;
convert the RF signal to an intermediate frequency (IF) signal; and
sample the IF signal to generate a digitized signal;
a modem unit configured to demodulate the digitized signal to generate a plurality of code words, wherein each code word of the plurality of code words includes a plurality of data bits and a plurality of parity bits; and
an decoder unit configured to:
decode a given one of the plurality of code words using each data bit of the plurality of data bits and a first partial subset of the plurality of parity bits of the given one of the plurality of code words and dependent upon a second partial subset of the plurality of parity check equations; and
re-decode, responsive to a determination that the decode of the given one of the plurality of code words failed, the given one of the plurality of code words using the data bits and each parity bit of the plurality of parity bits and dependent upon each parity check equation of the plurality of parity check equations;
wherein a first sub-matrix of the parity sub-matrix corresponding to the first partial subset of the plurality of parity bits and to the second partial subset of the plurality of parity check equations comprises a lower triangular matrix.

2. The apparatus of claim 1, wherein sub-matrix comprises a rectangular block of elements, wherein elements of the rectangular block of elements below a main diagonal of the parity sub-matrix are zero.

3. The apparatus of claim 1, wherein each parity check equation of the plurality of parity check equations evaluates to zero for a valid code word.

4. The apparatus of claim 1, wherein the ECC comprises a Low Density Parity Check (LDPC) code.

5. The apparatus of claim 1, wherein a number of parity check equations included in the second partial subset of the plurality of parity check equations is equal a number of parity bits included in the first partial subset of the plurality of parity bits of the given one of the plurality of code words.

6. A method, comprising:
receiving a radio frequency (RF) signal, wherein the RF signal includes data encoded with an error correction code (ECC), wherein the ECC is defined by a plurality of parity check equations, and wherein a parity check matrix representing the ECC includes a data sub-matrix and a parity sub-matrix;
converting the RF signal to an intermediate frequency (IF) signal;
sampling the IF signal to generate a digitized signal;
demodulating the digitized signal to generate a plurality of code words, wherein each code word of the plurality of code words includes a plurality of data bits and a plurality of parity bits;
decoding a given one of the plurality of code words using each data bit of the plurality of data bits and a first partial subset of the plurality of parity bits of the given one of the plurality of code words and dependent upon a second partial subset of the plurality of parity check equations; and
re-decoding, responsive to determining that the decode of the given one of the plurality of code words failed, the given one of the plurality of code words using the data bits and each parity bit of the plurality of parity bits and dependent upon each parity check equation of the plurality of parity check equations;
wherein a first sub-matrix of the parity sub-matrix corresponding to the first partial subset of the plurality of parity bits and to the second partial subset of the plurality of parity check equations comprises a lower triangular matrix.

7. The method of claim 6, wherein sub-matrix comprises a rectangular block of elements, wherein elements of the rectangular block of elements below a main diagonal of the parity sub-matrix are zero.

8. The method of claim 6, wherein each parity check equation of the plurality of parity check equations evaluates to zero for a valid code word.

9. The method of claim 6, wherein the ECC comprises a Low Density Parity Check (LDPC) code.

10. The method of claim 6, wherein a number of parity check equations included in the second partial subset of the plurality of parity check equations is equal a number of parity bits included in the first partial subset of the plurality of parity bits of the given one of the plurality of code words.

11. The method of claim 6, wherein a number of parity check equations included in the second partial subset of the plurality of parity check equations is less than a number of parity bits included in the first partial subset of the plurality of parity bits of the given one of the plurality of code words.

12. A computer-accessible non-transitory storage medium having program instructions stored therein that, in response to execution by a computer system, cause the computer system to perform operations including:
   receiving a radio frequency (RF) signal, wherein the RF signal includes data encoded with an error correction code (ECC), wherein the ECC is defined by a plurality of parity check equations, and wherein a parity check matrix representing the ECC includes a data sub-matrix and a parity sub-matrix;
   converting the RF signal to an intermediate frequency (IF) signal;
   sampling the IF signal to generate a digitized signal;
   demodulating the digitized signal to generate a plurality of code words, wherein each code word of the plurality of code words includes a plurality of data bits and a plurality of parity bits;
   decoding a given one of the plurality of code words using each data bit of the plurality of data bits and a first partial subset of the plurality of parity bits of the given one of the plurality of code words and dependent upon a second partial subset of the plurality of parity check equations; and
   re-decoding, responsive to determining that the decode of the given one of the plurality of code words failed, the given one of the plurality of code words using the data bits and each parity bit of the plurality of parity bits and dependent upon each parity check equation of the plurality of parity check equations;
   wherein a first sub-matrix of the parity sub-matrix corresponding to the first partial subset of the plurality of parity bits and to the second partial subset of the plurality of parity check equations comprises a lower triangular matrix.

13. The computer-accessible non-transitory storage medium of claim 12, wherein sub-matrix comprises a rectangular block of elements, wherein elements of the rectangular block of elements below a main diagonal of the parity sub-matrix are zero.

14. The computer-accessible non-transitory storage medium of claim 12, wherein each parity check equation of the plurality of parity check equations evaluates to zero for a valid code word.

15. The computer-accessible non-transitory storage medium of claim 12, wherein the ECC comprises a Low Density Parity Check (LDPC) code.

16. The computer-accessible non-transitory storage medium of claim 12, wherein a number of parity check equations included in the second partial subset of the plurality of parity check equations is equal a number of parity bits included in the first partial subset of the plurality of parity bits of the given one of the plurality of code words.

17. The computer-accessible non-transitory storage medium of claim 12, wherein a number of parity check equations included in the second partial subset of the plurality of parity check equations is less than a number of parity bits included in the first partial subset of the plurality of parity bits of the given one of the plurality of code words.

* * * * *